(12) United States Patent
Liu et al.

(10) Patent No.: US 6,680,962 B2
(45) Date of Patent: Jan. 20, 2004

(54) NARROW LINEWIDTH, LOW FREQUENCY CHIRPING AND BROAD WAVELENGTH TUNABLE RING RESONATOR COUPLED LASERS

(76) Inventors: Bin Liu, 450 Whitman St., Apt #65, Goleta, CA (US) 93117; Ali Shakouri, 246 Dickens Way, Santa Cruz, CA (US) 95064

( * ) Notice: Subject to any disclaimer, the term of this patent is extended or adjusted under 35 U.S.C. 154(b) by 0 days.

(21) Appl. No.: 10/136,925

(22) Filed: Apr. 29, 2002

(65) Prior Publication Data

US 2003/0202555 A1 Oct. 30, 2003

(51) Int. Cl.$^7$ ............................................. H01S 3/083
(52) U.S. Cl. .............................. 372/94; 372/43; 372/44; 372/45; 372/46; 372/47; 372/48; 372/99
(58) Field of Search ................................ 372/94, 43–50, 372/99

(56) References Cited

U.S. PATENT DOCUMENTS

| | | | |
|---|---|---|---|
| 5,349,601 A | * | 9/1994 | Hohimer et al. ............... 372/94 |
| 5,398,256 A | * | 3/1995 | Hohimer et al. ............... 372/94 |
| 5,998,781 A | * | 12/1999 | Vawter et al. .......... 250/227.11 |
| 6,009,115 A | | 12/1999 | Ho |

OTHER PUBLICATIONS

Jayarama, V. "Theory, Design and performand of Extended tuning range semiconductor laser with sample gratings" IEEE Journal of Quantum Electrictonic, vol. 23, No. 6, Jun. 1993 pp. 1824–1834.*

Wang S. "Principles of distributed feedback and distributed Bragg reflector lasers" Journal of Quantum Electronics, vol. QE–10, No. 4, Apr. 1974, pp. 413–427.*

Andrew Shuh–Huei Liao and Shyh Wang, "Semiconductor injection lasers with a circular resonator", Applied Physics Letters, vol. 36, No. 10, pp. 801–803, May 15, 1980.

J. V. Hryweiewicz, P. P. Absil, B.E. Little, R.A. Wilson and P. T. Ho, "High order filter response in coupled micro ring resonators", IEEE Photonics Technology Letters, vol. 12, No. 3, Mar. 2000, pp. 320–322.

Dominik G. Rabus and Michael Hamacher, "MMI–coupled ring resonators in GaInAsP–InP," IEEE Photonics Technology Letters, vol. 13, No. 8, Aug. 2001, pp. 812–814.

\* cited by examiner

*Primary Examiner*—Paul Ip
*Assistant Examiner*—Delma R. Flores-Ruiz (57) ABSTRACT

A ring resonator coupled laser is described, which has a gain region for creating light radiation, ring resonators for providing a strong mode selection and Vernier effect for wide wavelength tunability, passive waveguides for coupling the light and a pair of reflective mirrors for forming a laser cavity. By combining the ring resonators with the reflective mirrors, a strongly frequency-dependent passive mirror with complex amplitude reflectivity is formed and this ring resonator coupled laser exhibits single longitudinal mode operation with a high side mode suppression ratio, narrow linewidth and reduced frequency chirp. By using two slightly different ring resonators, the wavelength tunability is greatly enhanced. Thus, electro-optic effect is preferred for high speed wavelength tuning in the ring resonator coupled laser.

11 Claims, 8 Drawing Sheets

Race track shape

Rectangle shape with 45 degree reflectors in four corners

Micro-disk resonator

NARROW LINEWIDTH, LOW FREQUENCY CHIRPING AND BROAD WAVELENGTH TUNABLE RING RESONATOR COUPLED LASERS

FIELD OF THE INVENTION

The present invention relates to laser devices in general and, more particularly, to laser configurations exhibiting narrow linewidth, low frequency chirp and broad wavelength tunability.

BACKGROUND OF THE INVENTION

Single longitudinal mode laser sources with narrow linewidth, low frequency chirping and broad wavelength tunability are the essential components in optical communication systems, sensing systems and spectroscopy.

To achieve single longitudinal mode operation, it is widely recognized that some forms of filtering structure must be introduced in the laser cavity. The main approaches are the distributed feedback (DFB) laser [H. Kogelnik and C. V. Shank, "Coupled-eave theory of distributed feedback lasers", Journal of Applied Physics, vol. 43, no. 5, pp. 2327–2335, 1972] and the distributed Bragg reflector (DBR) laser [S. Wang, "Principals of distributed feedback and distributed Bragg-reflector waveguides", IEEE Journal of Quantum Electronics, vol. QE-10, pp. 413–427, 1974.]. In both structures, a grating was embedded in the laser cavity with or without gain in the grating regions. Compared to conventional Fabry-Perot lasers, grating-based DFB and DBR lasers need much more complicated material growth and processes and add considerable cost.

Once single longitudinal mode operation is achieved, the laser linewidth needs to be as narrow as possible to reduce the phase noise. It is well known that increasing the photon lifetime is the most effective way to reduce the linewidth. Generally, this could be achieved by extending the laser effective cavity length. However, the physical cavity length is inherently limited in monolithic DFB and DBR lasers. Therefore, to achieve a very narrow linewidth in DFB and DBR lasers is difficult. Another approach is external cavity lasers, which allow a dramatic cavity length increase and yield very narrow linewidth [R. Wyatt, "Spectral linewidth of external cavity semiconductor lasers with strong, frequency-selective feedback," Electronics Letters, Vol. 21, pp. 658–659, 1985.]. But the bulky device size, the complicate package and the high cost of external cavity lasers limit their applications.

Wide wavelength tunability is necessary for many applications. The lasing wavelength in standard DFB and DBR lasers can be tuned by changing the refractive indices of different layers. But this tuning is limited to a small range due to the small change of the refractive index with electro-optic, electro-absorption, or thermo-optic effects. To leveraging the wavelength tunability, sampled gratings [V. Jayaraman, Z. M. Chuang, and L. A. Coldren, "Theory, Design, and Performance of extended tuning range semiconductor lasers with sampled gratings," IEEE Journal Quantum Electronics, Vol. QE-29, pp. 1817–1823, 1993.] have been introduced to DBR lasers. By using Vernier effect in two sampled gratings, the wavelength tuning range can be enhanced a factor of ~10 with the maximum index change ~1% by injection carriers (electrons or holes) in different layers. Carrier injection is attractive for its large index change, but it also has several disadvantages. First, the carrier injection causes the internal optical loss, which affects the uniformity of lasing threshold currents and the electron to photon efficiencies at different wavelengths. Second, the switching time via carrier injection is in the range of tens of nanoseconds, not fast enough for some applications. For ultrafast tuning speed, electrooptic (EO) effect is preferred which has no induced optical loss. But the index change by EO effect is much smaller than the change by carrier injection. Thus, a large tuning enhancement is needed to use the EO effect for the tuning purpose.

Micro-ring lasers [J. P. Hohimer, D. C. Craft, G. R. Hadley, G. A. Vawter and M. E. Warren, "Single-frequency continuous-wave operation of ring resonator diode lasers," Applied Physics Letters, Vol. 59, pp. 3360–3362, 1991.] were thought to be another laser structure for single longitudinal operation. But conventional ring lasers, where the active ring resonator replaces the standing wave Fabry-Perot cavity, have the same limitations to achieve narrow linewidth and wide wavelength tunability as Fabry-Perot lasers due to the limited cavity length and the index change. The ring laser has another disadvantage of the inherent instability caused by the mode competition between the clockwise and anti-clockwise propagation traveling-waves.

SUMMARY OF THE INVENTION

It is an object of the present invention to provide a laser arrangement which operates at a single longitudinal mode with a high side mode suppression ratio and without the grating mode selection filter in the aforementioned laser arrangements.

It is another object of the present invention to provide a laser source that exhibits very narrow linewidth and low frequency chirping.

It is still another object of the present invention to provide a laser source which has a wide wavelength tuning range.

It is yet a further object of the present invention to provide a laser source which has a very fast wavelength tuning speed.

Other objects and advantages of the present invention will become apparent from a consideration of the following detailed description with reference to the accompanying drawings.

The foregoing objects have been achieved by a passive ring resonator coupled laser of the present invention comprising passive micro-ring resonator, active gain section, a pair of reflective mirrors and passive optical waveguides connecting the reflective mirrors, the ring resonator and the gain section.

A preferred embodiment of the ring resonator coupled laser according to the invention is characterized in that one passive ring resonator is interposed between one of the two mirrors and the gain section and connected by the two passive waveguides. The passive ring resonator acts as a strong mode selector for obtaining a single longitudinal mode of operation over a very narrow frequency linewidth with a very high side mode suppression ratio.

Another preferred embodiment of the passive ring resonator coupled laser according to the invention is characterized in that a pair of ring resonators are interposed between the two mirrors and the gain section, and connected by the passive waveguides. The two ring resonators have two sets of transmission spectra with slightly different wavelength peak spacing. By adjusting the refractive index of the one or two ring resonators, one of the peaks in the two sets of spectra can be chosen to match to a desired wavelength and a wide wavelength tuning range of the laser can be achieved.

Electro-optic effect is preferred as a mean of adjusting the refractive index for high speed wavelength tuning, but not the only possible mean.

BRIEF DESCRIPTION OF THE DRAWINGS

The present invention is illustrated by way of example, and not limitation, by the figures of the accompanying drawings in which like references indicate similar elements and in which.

DETAILED DESCRIPTION

Figure 1:
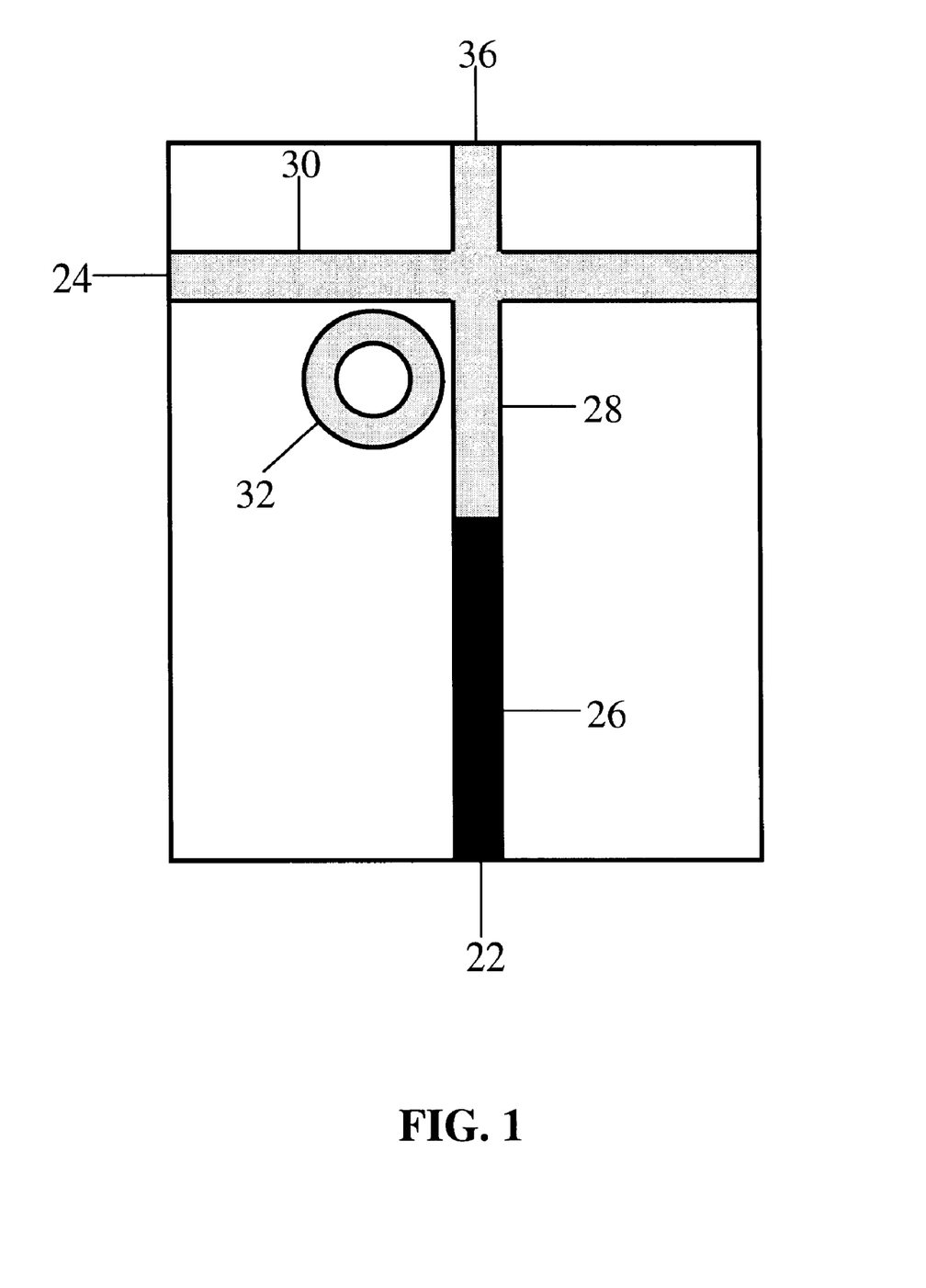
FIG. 1 is a schematic representation of a preferred embodiment of the ring resonator coupled laser with a single ring resonator.
Figure 2:
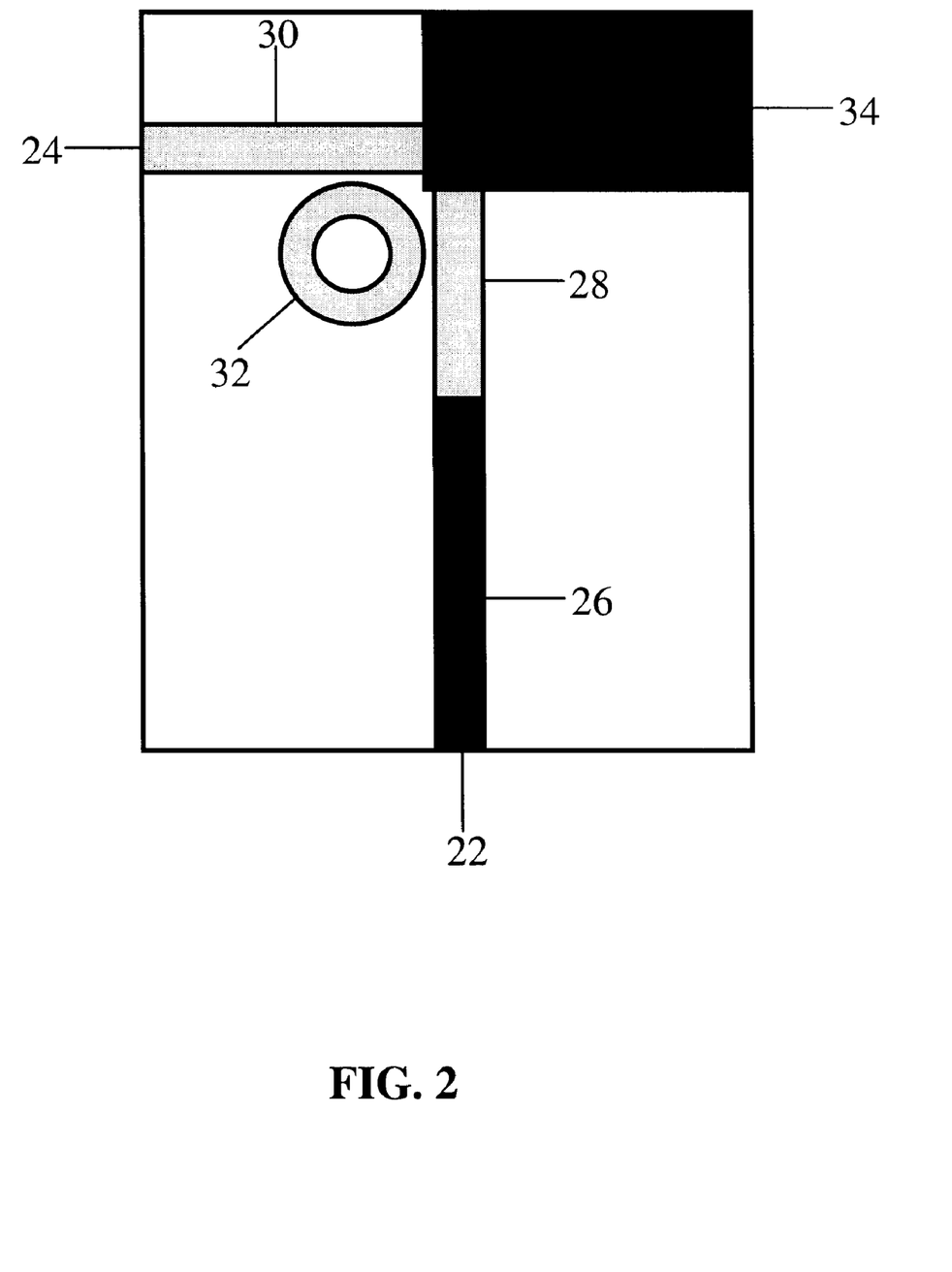
FIG. 2 is a schematic representation of an alternative embodiment of the ring resonator coupled laser.
Figure 3:
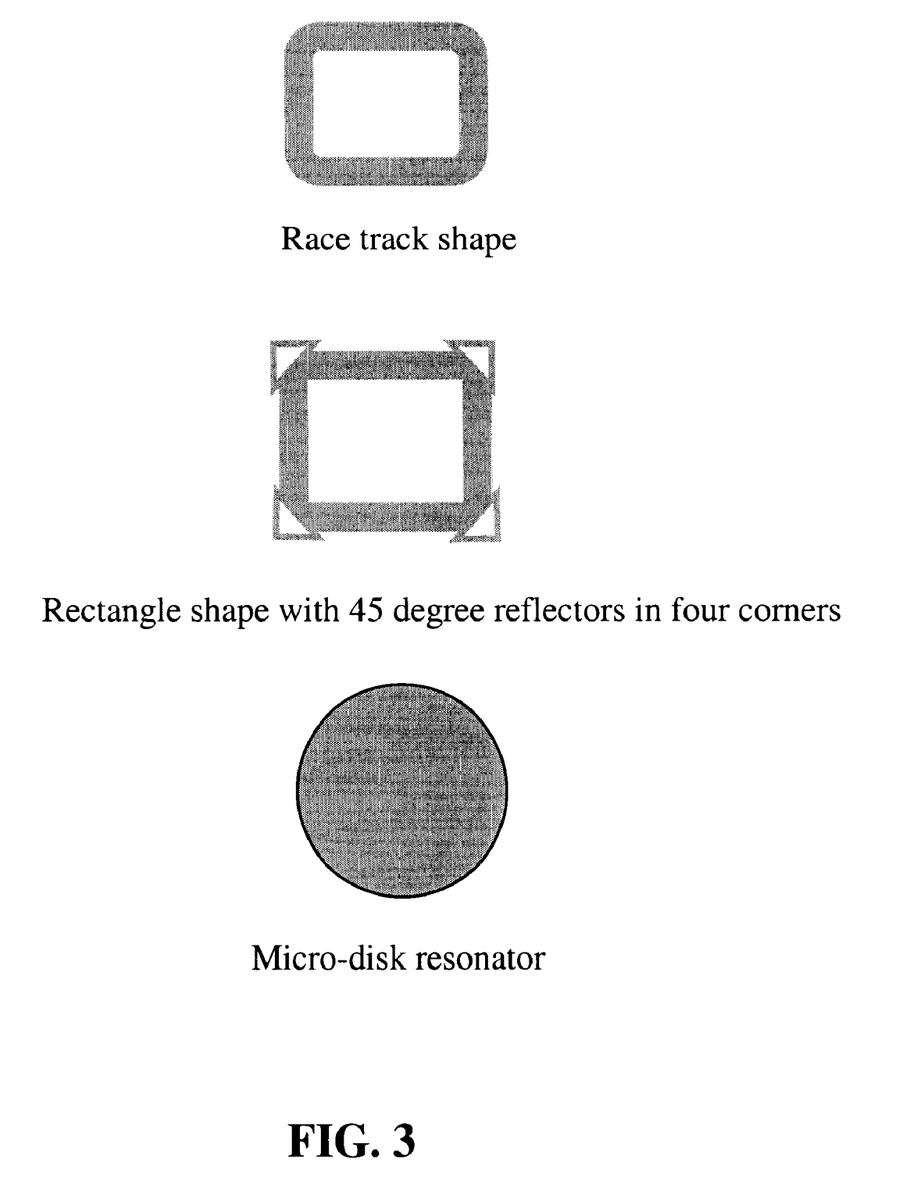
FIG. 3 shows other traveling wave supported resonators: trace-track shape; rectangle shape with four 45 degree reflectors and micro-disk resonator.

FIG. 1 schematically illustrates a first embodiment of a passive ring resonator coupled laser according to the invention. The passive ring resonator coupled laser compromises an active gain region 26, a passive ring resonator 32, two passive straight waveguides 28 and 30 and a pair of reflective mirrors 22 and 24. All of those components can be integrated in a semiconductor wafer. The gain region 26 generates laser radiation and provides light amplification. The light from the gain region 26 is coupled to the passive waveguide 28. The ring resonator 32 is a mode selection filter, which couples the light at the resonance wavelength between the passive waveguides 28 and 30. The reflective mirrors 22 and 24 bounces the selectively coupled light back and forth to form a laser cavity. The two mirrors 22 and 24 can be formed by cleaving the two facets of the passive waveguide 30 and the gain region 22 in semiconductors. The cleaved facets can be coated to increase the reflectivity. Gratings also can be used as the reflective mirrors. The light with off-resonance wavelength needs to be removed from the waveguide 28 to avoid forming another laser cavity between the mirror 22 and the facet 36. An antireflection coating on facet 36 is a possible method. A more efficient way is to add an absorption region 34, which is illustrated in FIG. 2 as an alternative embodiment. Then, the absorption region 34 extinguishes the filtered spontaneous light from the gain region 26 and the possible back reflections. The gain 26 and the absorption 34 regions can have the same material structures with and without active pumping respectively. It is worthy of note that the ring resonator does not need to be a circular shape and any traveling wave supported resonators have the same effects, such as race-track shape, rectangle shape with 45 degree reflectors or micro-disk as shown in FIG. 3. In the passive ring coupled laser, by changing the index in the ring resonator and passive straight waveguides, one can achieve coarse and fine tuning of the laser wavelength and match the cavity mode with the resonance peak wavelength.

Figure 4:
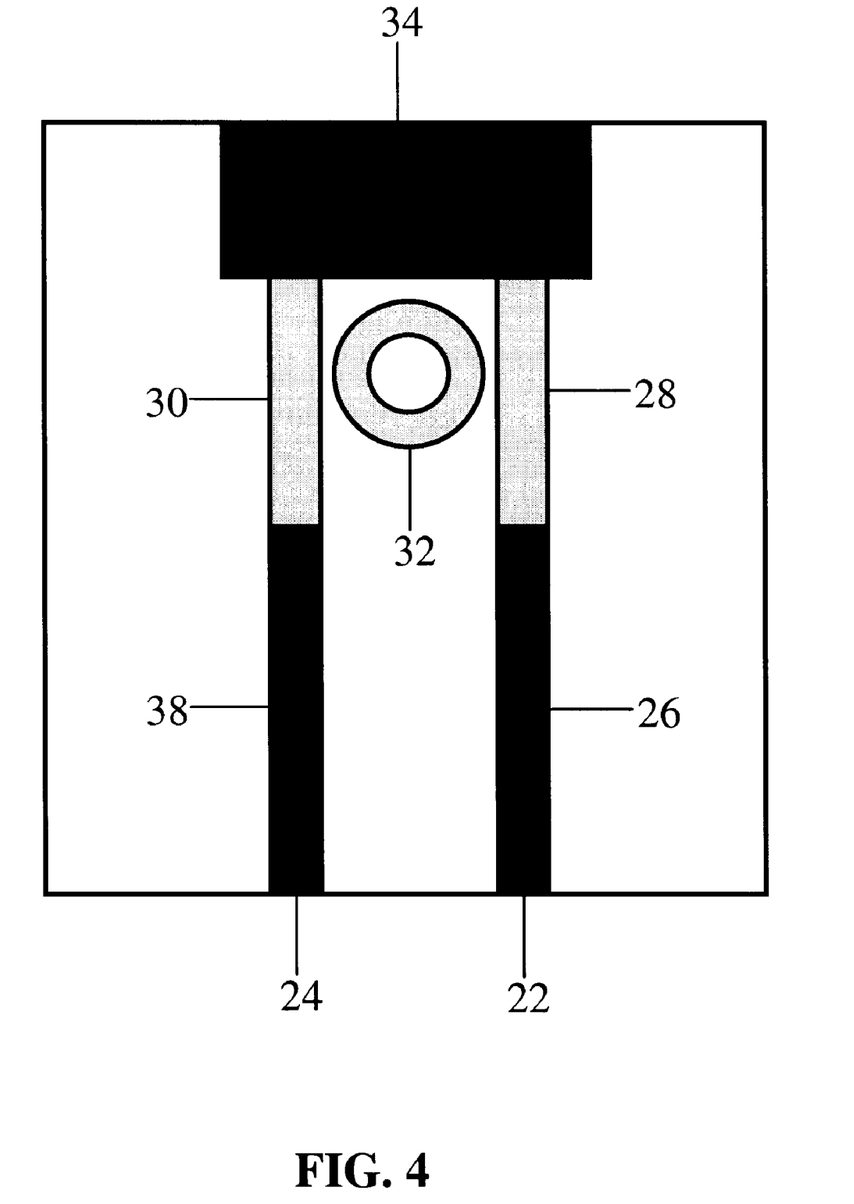
FIG. 4 is a schematic representation of another alternative embodiment of the ring resonator coupled laser.

In the preferred embodiments shown in FIG. 1 and FIG. 2, the two passive waveguides 28 and 30 are crossed perpendicularly. Those two waveguides 28 and 30 also can be arranged in other ways. FIG. 4 is an alternative embodiment, where the two waveguides 28 and 30 are parallel. This structure makes the two mirrors 22 and 24 in the same side of the chip and may facilitate fabrication of the ring resonator coupled laser. To compensate the possible extra loss, an extra gain region 38 is added.

In the present invention, the Lorentzian filtering mechanism from the traveling wave supported ring resonator 32 provides a strong mode selection, which is essential for dynamic single mode operation. Via the passive ring resonator 32 between the passive waveguides 28 and 30, only the light with a very narrow wavelength range from the gain region 26 will be coupled to the waveguide 30. For a lossless ring resonator, the complete coupling between the passive waveguides 28 and 30 happens when the wavelength satisfies the resonance condition $\lambda=nl/M$, where n is the group index of the ring resonator, l is one round trip length of the resonator, M is an integer, and $k1=k2$, where $k1$ and $k2$ are the amplitude coupling coefficients between the ring resonator 32 and the waveguides 28, 30 respectively. The light with a frequency that does not correspond to the resonant frequency of the passive ring resonator 32 is absorbed by the absorption region 34 in FIG. 2 or escapes from the facet 36 in FIG. 1. Therefore, the light with the resonance wavelength has the maximum reflectivity and thus the minimum threshold to get lasing. Compared to the Sinc-type filters in the conventional DFB and DBR lasers, the Lorentzian-type filtering of passive ring resonators provides an ultra narrow bandwidth with a very small device size. This will enable the passive ring resonator coupled laser to have a high side mode suppression ratio (SMSR).

It is well known that increasing the effective laser cavity length which makes photon lifetime longer is the most effective way to reduce the linewidth and frequency chirp of semiconductor lasers. One main advantage of the passive ring resonator coupled laser is that the effective cavity length can be extremely extended. This is the biggest difference between the passive ring resonator coupled lasers and the conventional active ring and Fabry-Perot lasers. In active ring lasers, the traveling wave ring resonator replaces the standing wave Fabry-Perot cavity and the cavity loss is due to the coupling between the ring and the output waveguides. Therefore, to increase the photon lifetime one must increase the physical length of the ring and/or reduce the coupling. These will be limited by the device size and the output power. In the case of ring resonator coupled lasers, the ring resonator is used as a passive mode selector. Thus, a frequency-dependent passive mirror with complex amplitude reflectivity is formed by the combination of a coupled ring resonator with a reflection mirror. This frequency dependent passive mirror can considerably extend the effective cavity length at the lasing wavelength. For the single lossless ring coupled laser, the effective cavity length is $l_{eff}=(1-k^2)l/k^2$ at resonance, where l is the round trip length of the ring resonator 32, and k=k1=k2 is the amplitude coupling coefficient between the passive ring resonator 32 and the passive waveguides 28, 30 respectively. By adjusting the coupling strength, one can dramatically increase the effective cavity length and the photon lifetime. Thus, the laser linewidth and the frequency chirp can be greatly reduced. Theoretically, A linewidth reduction by more than three orders of magnitude can be achieved with k=0.1. Therefore, without a long external cavity, >100 KHz linewidth is feasible by using a weakly coupled ($\kappa\approx0.1$) microring resonator in the passive ring coupled laser. Such a narrow linewidth could only be realized in a very long external cavity laser before. The frequency chirp of a weakly coupled ring resonator laser can also be one order of magnitude better than the conventional semiconductor lasers. To further reduce the linewidth and the frequency chirp, one may operate the ring resonator coupled laser slightly away from the resonant peak wavelength. This is referred to as detuned loading. However the laser threshold will be considerably increased.

Figure 5:
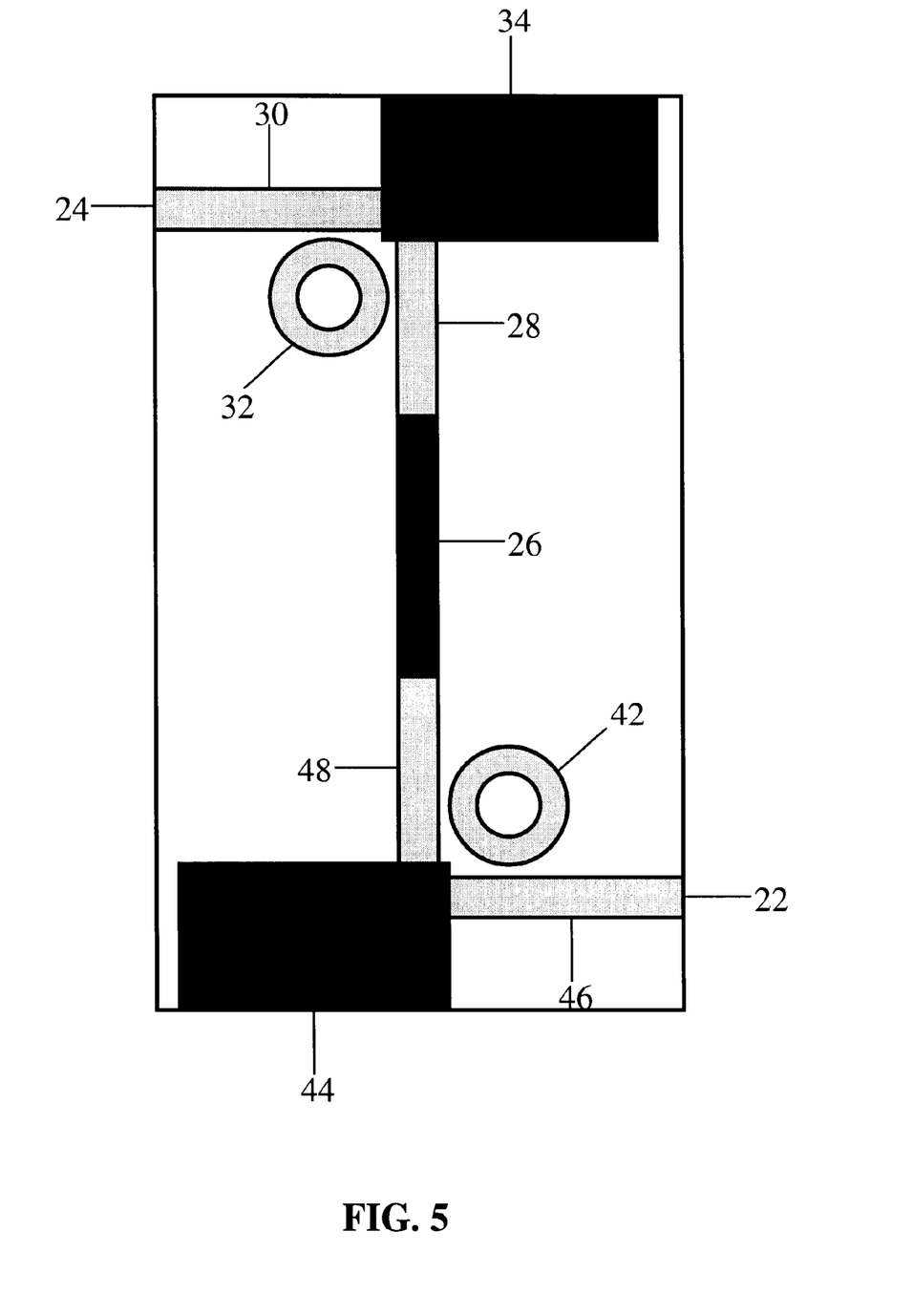
FIG. 5 is a schematic representation of a preferred alternative embodiment of the ring resonator coupled laser with two ring resonators for the purpose of wavelength tuning.

In the single ring resonator coupled laser, the lasing wavelength can be tuned by changing the refractive index of the ring resonator 32. But the wavelength tuning range is limited due to the small refractive index change, which generally is limited to ~1%. To leverage the wavelength tuning range, a preferred embodiment of a double passive ring resonator coupled laser according to the invention is illustrated in FIG. 5. The double ring resonator coupled laser compromises an active gain region 26, two passive ring resonators 32 and 42, passive waveguides 28, 30, 46 and 48, a pair of reflective mirrors 22 and 24 and two absorption regions 34 and 44. The two passive microring resonators 32 and 34 have slightly different radii (or slightly different effective indices) providing the mode selection and wavelength tuning mechanisms. Four passive waveguides 28, 30, 46 and 48 connect the ring resonators and the gain region.

Figure 6:
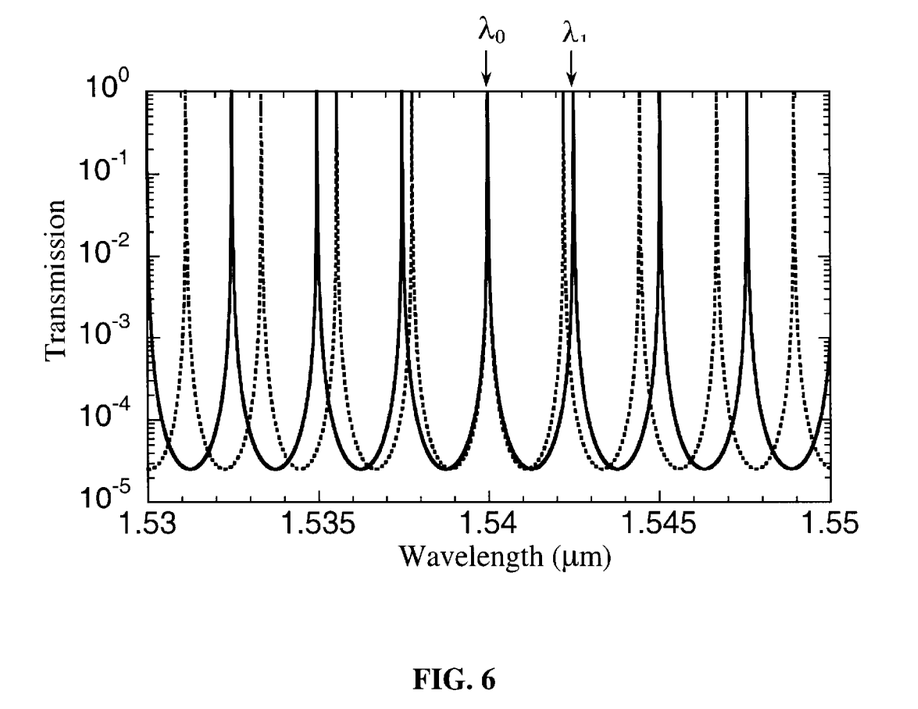
FIG. 6 is the transmission spectra of the two different ring resonators.

FIG. 6 illustrates the basic tuning idea of the double ring resonator coupled laser. Each ring resonator has a set of transmission spectra. The spacing between the wavelength peaks in each ring is the free spectral range $FSR=\lambda^2/(nl)$, where $\lambda$ is the wavelength, n is the effective index of the ring and l is the round trip length of the ring. The two rings have slightly different round trip lengths (or effective indices). Therefore the two sets of transmission peak combs have slightly different peak spacing. The wavelength tuning is achieved by aligning the peaks in the two sets of combs with the adjustment of index in one or both ring resonators in the double ring resonator coupled laser. This is known as Vernier effect. In the single ring resonator coupled lasers, to tune the lasing wavelength from a peak wavelength $\lambda_0$ to the adjacent next peak wavelength $\lambda_1$ ($\lambda_1\approx\lambda_0+\lambda_0^2/(n_a l_a)$) will require the index change $\Delta n=\lambda_0/l_a$, where $l_a$ and $n_a$ are the round trip length and the index of the ring 32. In contrast, the index change for tuning the lasing wavelength from $\lambda_0$ (the wavelength peaks of the two rings 32 and 42 are aligned at $\lambda_0$ before tuning) to $\lambda_1$ is about $\lambda_0 \Delta l/l_a^2$, here assuming the indices of the two rings 32 and 42 are the same and $\Delta l=l_a-l_b$ is the round trip length difference between two rings 32 and 42. Thus, the wavelength tuning is greatly enhanced with a factor of $l_a/\Delta l$. If the two rings have the same effective indices when there is no tuning, the wavelength tuning enhancement factor M is given by $M\approx l_a/\Delta l$. At resonance, $n_a l_a=M_a \lambda_0$ and $n_b l_b=M_b \lambda_0$, $M_a$ and $M_b$ are the resonance mode numbers of the ring 32 and 42 at the center wavelength $\lambda_0$ without tuning, and $M_b=M_a+\Delta M$ ($\Delta M$ is an integer.)

Therefore, the tuning enhancement factor can be expressed by another form: $M=M_a/\Delta M$. When $\Delta M=1$, one may get the maximum tuning range of $0-2\lambda_0$. For practical applications, the material gain bandwidth limits the possible maximum tuning range of $\lambda_0-\Delta\lambda_g$ to $\lambda_0+\Delta\lambda_g$, ($\Delta\lambda_g$ is the half width of the material gain spectrum,) then $\Delta M=\lambda_0/\Delta\lambda_g$ and the corresponding tuning enhancement $M=\Delta\lambda_g/FSR_1$, $FSR_1$ is the free spectral range of the ring 32. This equals to the resonant peak number located in a half of the material gain bandwidth. Compared to the prior monolithic tunable lasers, the double ring resonant coupled laser could offer a much larger tuning enhancement because of the inherent features of the ring resonators. First, the ring resonators have the uniform peak transmission at all resonant peaks, which means the uniform thresholds and quantum efficiencies between the mode hopping wavelengths. In contrast, the periodic peak power reflectivities decay with the number of peaks in the sampled-grating DBR lasers, which limits the tuning enhancement to $\approx 10$. Second, the Lorentzian-type filtering of ring resonators provides an ultra narrow bandwidth with a very small device size. The peak spacing difference between two sets of transmission combs could be much smaller than that in the Sinc-type filters, and a high side mode suppression ratio (SMSR) is still achievable.

The large tuning enhancement has many advantages. The available gain bandwidth in semiconductor is about 100 nm. Therefore, a tuning enhancement factor of 10 is large enough to cover the whole bandwidth with the maximum index change $\Delta n/n \sim 1\%$ by carrier injection. Carrier injection is attractive for its large index change, but it also has several inherent disadvantages. First, the carrier injection causes the internal optical loss, which affects the uniformity of lasing thresholds and the quantum efficiencies at different wavelengths. With a large tuning enhancement and a small index change requirement (~0.1% for M=100), the tuning current is dramatically decreased and the internal loss is minimized. On the other hand, the switching time via carrier injection is in the range of tens of nanoseconds, not fast enough for some applications. For ultrafast tuning speed, electrooptic (EO) effect is preferred which has no induced loss. But the index change by EO effect is about one order of magnitude smaller than the change by carrier injection, which means a large tuning enhancement factor of 50–100 is needed to cover the gain bandwidth. For example, if $\Delta\lambda_g=50$ nm and FSR=1.25 nm, with a requirement of ~0.1% index change to cover this tuning range, one can find $\Delta M=30$, $M=40$ and $M_1=1200$ at $\lambda_0=1500$ nm. Such a large tuning enhancement is impossible in the prior tunable lasers, but it is feasible with the double ring resonator coupled lasers. Thus, using EO effect, a wide tuning range and ultrafast switching speed can be achieved with the double ring resonator coupled laser.

The maximum tuning enhancement of the double ring resonator coupled laser is limited by the required side mode suppression ratio (SMSR). Two different side competing modes need to be considered. One is the adjacent cavity mode; the other is the adjacent resonant mode of the rings. By introducing the second ring in the double ring resonator coupled laser, the transmission is squared. Thus, the loss margin between the resonance peak and first side cavity mode is enhanced compared to the single ring resonator coupled laser. Theoretically, >40 dB SMSR in the double ring resonator coupled laser could be assured at 1 mW output power for a typical semiconductor material. So, the adjacent cavity mode will not restrict the tuning enhancement in DR-RCLs.

The ultimate limitation of the tuning leverage in the double ring resonator coupled laser comes from the adjacent resonant mode of the rings. The transmission overlap could be significant between the two ring resonance peaks adjacent to the aligned center peak with the increase of the tuning enhancement. Benefiting from the ultra narrow bandwidth of the ring resonators 32 and 42, the double ring resonator coupled laser can achieve >1000 wavelength tuning enhancement with >40 dB adjacent resonant mode suppression at 1 mW power.

After the introduction of the second ring resonator in the double ring resonator coupled laser, the effective cavity length at the resonance wavelength is further extended. One can expect that the double ring resonator coupled lasers may achieve a very narrow linewidth and a very low frequency chirping. Those are other advantages over the prior tunable lasers.

Figure 7:
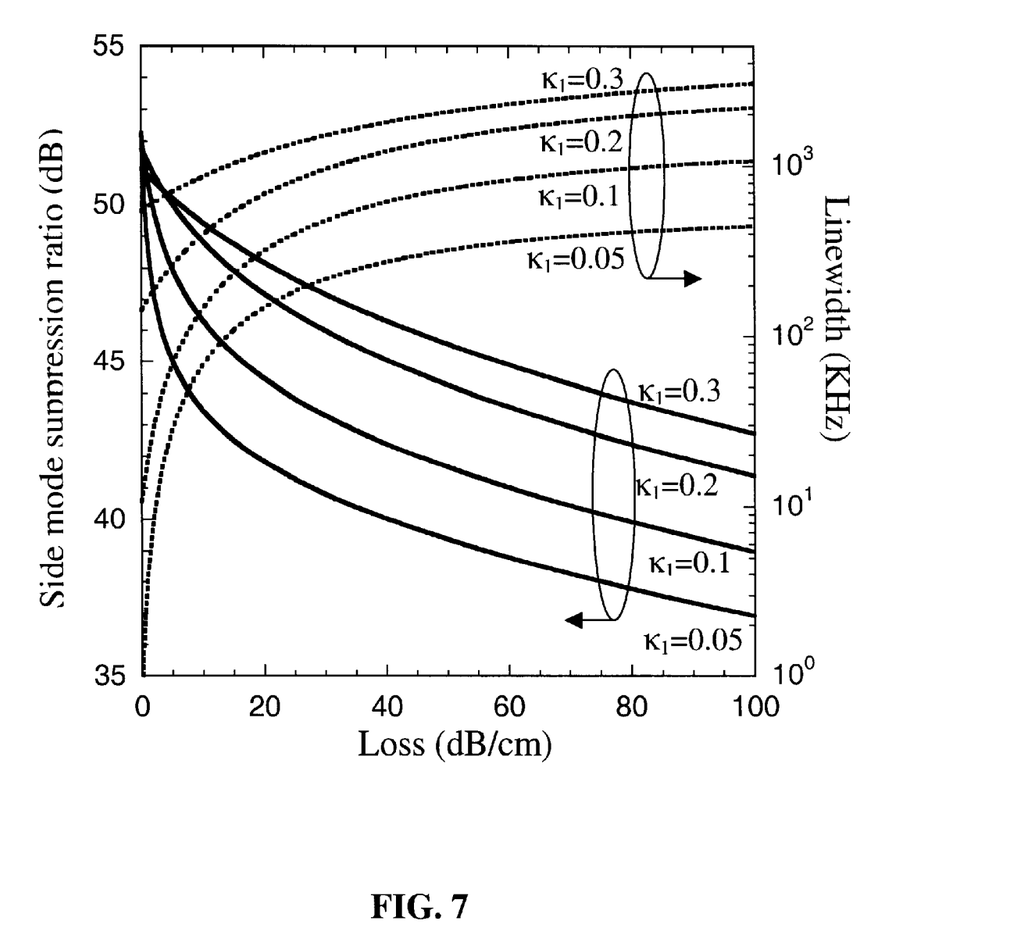
FIG. 7 is side mode suppression ratio and linewidth of an InGaAsP/InP passive ring resonator coupled laser as a function of the loss in the ring (the gain region length $l_g=400$ $\mu$m, the index of gain region $n_g=3.3$, the radius of the ring $r=20$ $\mu$m, the index of the ring $n=3$, $k2=\sqrt{1-(1-k_1^2)\exp(-\alpha l)}$ to get the maximum transmission, $\alpha$ is the optical loss in the ring. The threshold gain is 50 cm$^{-1}$ without the ring and the output power is 5 mW.)
Figure 8:
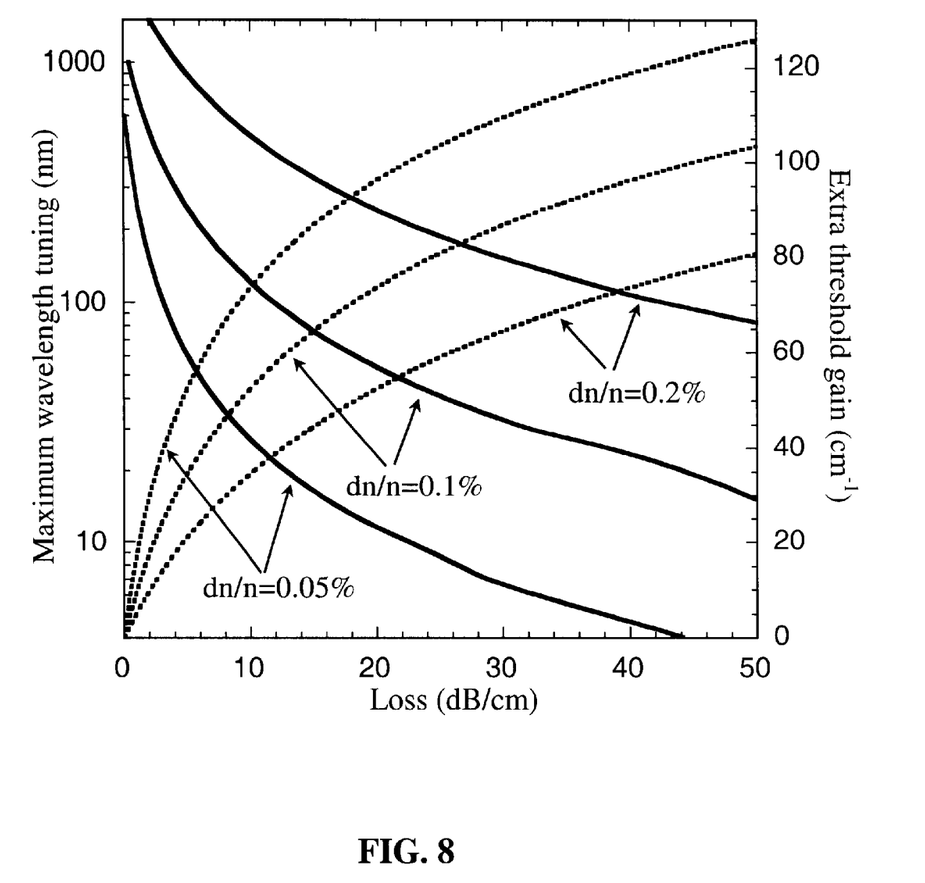
FIG. 8 is the maximum wavelength tuning range (solid line) and the extra threshold gain (dashed line) as a function of the optical loss in rings. Here, the side mode suppression ratio is set to 30 dB at 1 mW output, $k1=0.2$, the gain region length $l_g=5$ $\mu$m, the index of gain region $n_g=3.3$, the index of the ring $n=3$.

The loss is inevitable in microring resonators, which broadens the bandwidth and reduces the effective reflectivity of passive ring resonator coupled lasers. The effects of the loss on side mode suppression ratio (SMSR) of the adjacent cavity mode and the linewidth in single ring resonator coupled laser are shown in FIG. 7. Even with a loss of 40 dB/cm, single passive ring resonator coupled lasers still can reach >40 dB SMSR and <500 KHz linewidth at 5 mW output power for k1=0.1. These data are far better than conventional DBR/DFB lasers. FIG. 8 illustrates the maximum wavelength tuning range and the extra threshold gain as a function of the optical loss in the double ring resonator coupled lasers with the refractive index change of 0.05%, 0.1% and 0.2%, where k1=0.2 and SMSR is set to 30 dB at 1 mW output power, assuming no material gain bandwidth limitation exists. Clearly, to achieve 100 nm wavelength tuning with only 0.1% index change, one can tolerate the optical loss of >10 dB/cm. This optical loss is feasible in microring resonators.

In the foregoing specification, the invention has been described with reference to specific exemplary embodiments thereof. It will, however, be evident that various modifications and changes may be made thereto without departing from the broader spirit and scope of the invention as set forth in the appended claims. For example, an active amplification region can be added to the ring resonator to compensate the optical loss in the rings. Cascading multiple large ring resonators could achieve the same functions as a single microring. The specification and drawings are, accordingly, to be regarded in an illustrative sense rather than a restrictive sense.

What is claimed is:

1. A laser comprising:
    a ring resonator coupled to two optical waveguides means for acting as a mode selector and transferring light wavelength-selectively between said optical waveguides;
    an active gain region, which is positioned outside of said ring resonator and connected to one of said optical waveguides, means for amplifying light transmitted through said ring resonator;
    a pair of reflective mirrors placed to form a standing wave laser cavity with said gain region and said resonator coupled waveguides placed inside said standing wave laser cavity.

2. The ring resonator coupled laser as claimed in claim 1 wherein said ring resonator means for narrowing linewidth and reducing frequency chirp of said laser.

3. The ring resonator coupled laser as claimed in claim 1 wherein said mirrors are cleaved facets.

4. The ring resonator coupled laser as claimed in claim 1, further including an absorption region placed outside of said ring resonator and attached to the end of one of said waveguides that is directly connected to said gain region, means for extinguishing the filtered light from said gain region and avoiding forming another laser cavity in addition to said standing wave laser cavity from said mirrors.

5. A laser comprising:
    a first ring resonator coupled to two optical waveguides means for acting as a mode selector and transferring light wavelength-selectively between said first ring resonator coupled optical waveguides;
    a second ring resonator coupled to other two optical waveguides means for acting as a mode selector and transferring light wavelength-selectively between said second ring resonator coupled optical waveguides; and said first and said second ring resonators are connected in series so that the overall light transmission is the product of the transmissions of said first and said second ring resonators;
    an active gain region, which is positioned outside of said ring resonators and connected with one of each pair of said waveguides, means for amplifying light transmitted through said ring resonators;
    a pair of reflective mirrors placed to form a standing wave laser cavity with said gain region and said ring resonators coupled waveguides placed inside said standing wave laser cavity.

6. The ring resonator coupled laser as claimed in claim 5 wherein said two ring resonators have different round trip lengths.

7. The ring resonator coupled laser as claimed in claim 5 wherein refractive indices of said ring resonators are changeable independently to tune the lasing wavelength of said laser.

8. The ring resonator coupled laser as claimed in claim 7 wherein said refractive indices of said resonators are adjusted via electro-optic effect, means for achieving a fast tuning speed.

9. The ring resonator coupled laser as claimed in claim 5 wherein said ring resonators means for narrowing linewidth and reducing frequency chirp of said laser.

10. The ring resonator coupled laser as claimed in claim 5 wherein said mirrors are cleaved facets.

11. The ring resonator coupled laser as claimed in claim 5, further including two absorption regions placed outside of said ring resonators and attached to the ends of two of said waveguides that is directly connected to said gain region, means for extinguishing the filtered light from said gain region and avoiding forming another laser cavity in addition to said standing wave laser cavity from said mirrors.

* * * * *